(12) United States Patent
Cardi et al.

(10) Patent No.: US 10,770,608 B2
(45) Date of Patent: Sep. 8, 2020

(54) SEMI-TRANSPARENT THIN-FILM PHOTOVOLTAIC MONO CELL

(71) Applicant: Garmin Switzerland GmbH, Schaffhausen (CH)

(72) Inventors: Philippe Gilbert Frederic Cardi, G Re Asque (FR); Sylvain De Vecchi, Aix en Provence (FR)

(73) Assignee: Garmin Switzerland GmbH (CH)

( * ) Notice: Subject to any disclaimer, the term of this patent is extended or adjusted under 35 U.S.C. 154(b) by 0 days.

(21) Appl. No.: 14/893,024

(22) PCT Filed: May 22, 2014

(86) PCT No.: PCT/FR2014/000116
§ 371 (c)(1),
(2) Date: Nov. 20, 2015

(87) PCT Pub. No.: WO2014/188092
PCT Pub. Date: Nov. 27, 2014

(65) Prior Publication Data
US 2016/0126407 A1    May 5, 2016

(30) Foreign Application Priority Data

May 23, 2013  (FR) ...................................... 13 01180
Feb. 27, 2014  (FR) ...................................... 14 00493

(51) Int. Cl.
*H01L 31/0465* (2014.01)
*H01L 31/0463* (2014.01)
(Continued)

(52) U.S. Cl.
CPC .. *H01L 31/0463* (2014.12); *H01L 31/022425* (2013.01); *H01L 31/0465* (2014.12);
(Continued)

(58) Field of Classification Search
CPC ............. H01L 31/0468; H01L 31/0465; H01L 31/0463; H01L 31/0224; H01L 31/022425
See application file for complete search history.

(56) References Cited

U.S. PATENT DOCUMENTS 4,795,500 A    1/1989  Kishi et al.
5,131,954 A    7/1992  Vogeli et al.
(Continued)

FOREIGN PATENT DOCUMENTS

EP    0 500 451 A1    8/1992
EP    1 798 778 A2    6/2007
(Continued)

OTHER PUBLICATIONS

International Search Report (PCT/ISA/210) dated Oct. 2, 2014, by the European Patent Office as the International Searching Authority for International Application No. PCT/FR2014/000116.

*Primary Examiner* — Bethany L Martin
(74) *Attorney, Agent, or Firm* — Samuel M. Korte; Max M. Ali

(57) ABSTRACT

The invention relates to a photovoltaic mono cell that is semi-transparent to light, comprising a plurality of active photovoltaic zones that are separated by transparent zones, said active photovoltaic zones being formed from a stack of thin films arranged on a substrate that is transparent to light, said stack of thin films consisting at least of a transparent electrode, an absorber layer and a metal electrode, said transparent zones being apertures produced at least in the metal electrode and in the absorber layer in order to allow as much light as possible to pass, characterized in that it furthermore comprises an electrically conductive collecting gate arranged either making contact with the front electrode in order to decrease the electrical resistance of the transparent electrode, or making contact with the absorber in order (Continued)

to facilitate collection of the electrical current generated by said mono cell.

14 Claims, 10 Drawing Sheets

(51) Int. Cl.
    *H01L 31/0468*     (2014.01)
    *H01L 31/0224*     (2006.01)
    *H01L 31/18*     (2006.01)

(52) U.S. Cl.
    CPC ...... *H01L 31/0468* (2014.12); *H01L 31/1888* (2013.01); *Y02P 70/521* (2015.11)

(56) References Cited

U.S. PATENT DOCUMENTS

| | | |
|---|---|---|
| 5,254,179 A | 10/1993 | Ricaud et al. |
| 2007/0131271 A1 | 6/2007 | Lim et al. |
| 2007/0131272 A1 | 7/2007 | Lim et al. |
| 2010/0012173 A1 | 1/2010 | Kwon et al. |
| 2010/0018574 A1 | 1/2010 | Kwon et al. |
| 2010/0096008 A1 | 4/2010 | Lee |
| 2010/0167458 A1* | 7/2010 | Shin ................ H01L 31/022425 438/73 |
| 2010/0279458 A1* | 11/2010 | Yeh ................ H01L 31/022425 438/98 |
| 2011/0168243 A1* | 7/2011 | Elowe .............. H01L 31/02167 136/255 |
| 2011/0198643 A1* | 8/2011 | Kim ...................... H01L 33/507 257/98 |
| 2011/0239450 A1* | 10/2011 | Basol ...................... B32B 37/22 29/738 |
| 2011/0259395 A1* | 10/2011 | Wieting ............ H01L 21/02422 136/246 |
| 2011/0265843 A1* | 11/2011 | Lee ..................... H01L 31/0468 136/244 |
| 2012/0192924 A1 | 8/2012 | Basol |
| 2012/0236540 A1 | 9/2012 | Gilbert et al. |
| 2013/0000722 A1* | 1/2013 | Yamada ............ H01L 31/02363 136/256 |
| 2013/0092209 A1* | 4/2013 | Shin ..................... H01L 31/046 136/244 |
| 2013/0118569 A1* | 5/2013 | Lee ..................... H01L 31/0463 136/256 |
| 2013/0137210 A1* | 5/2013 | Cheng ............ H01L 31/022425 438/98 |
| 2013/0247969 A1 | 9/2013 | Kim |
| 2014/0166084 A1* | 6/2014 | Shim .................. H01L 31/0392 136/252 |

FOREIGN PATENT DOCUMENTS

| | | |
|---|---|---|
| EP | 1 798 779 A2 | 6/2007 |
| WO | WO 92/07386 A1 | 4/1992 |
| WO | WO 2008/093933 A1 | 8/2008 |

* cited by examiner

SEMI-TRANSPARENT THIN-FILM PHOTOVOLTAIC MONO CELL

TECHNICAL FIELD OF THE INVENTION

The present invention relates to the field of semi-transparent photovoltaic devices based on thin-film photovoltaic mono cells and intended at one and the same time to produce electricity and to see by transparency an image associated with the photovoltaic cell.

PRIOR ART

By thin or low-thickness film is meant photovoltaic films of any nature (organic, inorganic), the thickness of whose absorber lies in a bracket ranging from a few tens of nanometers (with organic photovoltaic materials) to a few tens of micrometers (with certain inorganic photovoltaic materials).

Such modules are beginning to reveal their usefulness in a whole series of commercial applications, especially in the field of photovoltaic screens for electronic devices such as cellular phones, touchpad tablets, screens of computers or of other devices provided with a semi-transparent photovoltaic screen, namely a screen which allows an image to appear through it to an observer placed in front of it, while capturing part of the incident light through the opaque photovoltaic active zones so as to transform it into electrical energy intended to power the device provided with such a screen.

As has been described in patent US2012/236540, in order to improve both their performance in regard to transparency and in regard to photovoltaic conversion efficiency, such screens are preferably, but not necessarily, associated with optics, for example in the form of an array of lenses overlaid on the image display system and on the semi-transparent photovoltaic module.

Now, a thin-film photovoltaic module is generally composed of several photovoltaic cells placed in series. Such a module has in particular been described in document EP0500451-B1. This design of module has the advantage of increasing the electrical voltage across the terminals of the module and of reducing the current conducted by the electrodes of the module and thus of reducing the resistive losses especially at the level of the transparent electrode situated in the front face of the cell. But this known design also has drawbacks. Thus, the photovoltaic cells are placed in series using a method for etching the various films of which the thin-film photovoltaic module is composed. The first etching, typically called P1, is that of the transparent electrode, also called the front electrode, which is deposited on the transparent substrate. The second etching called P2 is that of the photovoltaic absorber film, also called the absorber, since it absorbs the incident photons. The third etching, called P3, is that of the metallic electrode, also called the rear electrode, and/or of the photovoltaic absorber film. This design of photovoltaic modules does not pose any particular problem within the framework of their use in devices provided with coarse screens of large size. On the other hand, when the perception of the image quality of the screen of the device must be perfect from the point of view of the observer, this being the case for example for intelligent cellular phones (so-called "smartphones"), several drawbacks related to the design of the known semi-transparent photovoltaic modules are apparent.

Drawbacks Related to the Etching Offsets:

In plan view, for example from the point of view of an observer placed facing the module, the etchings P1, P2, P3 are slightly offset with respect to one another. On account of the limited precision of the etching techniques and of the tolerances taken in order not to overlay them, this offset may be more or less significant.

It follows from this that for each series placement of two adjacent cells, a width of photovoltaic material of the order of 0.3 mm becomes inactivate at the photovoltaic conversion level, thereby decreasing the overall conversion efficiency of the screen. For example, for typical dimensions of a smartphone (i.e. about $40 \times 70 = 2800$ mm$^2$), the loss of photovoltaic active surface area may range from 5% to 10%, i.e. up to 280 mm$^2$. This loss is therefore non-negligible and reduces the advantages that can be obtained moreover by adopting a photovoltaic semi-transparent screen.

Drawbacks Related to the Shadowing of a Cell:

Another consequence of placing photovoltaic cells in series is the sensitivity to the shadowing of a module using cells thus connected. Indeed, if one of the cells is under lower lighting than that of the other cells (in the case of a cast shadow or shadowing for example), the decline in electrical production of this shadowed cell will affect all the other cells, since the electric current will be reduced in the same way in all the cells connected in series. In the same manner, if one of the cells is less efficacious than the others because of defects of homogeneity of the deposition of photovoltaic substance or of the doping for example, it is this deficient cell which will penalize the others and reduce the performance of the photovoltaic module overall.

Drawbacks Related to the Visibility of the Etching Lines:

The etching of the transparent electrode induces a local change of the optical index of the zone which is traversed by the light emitted by a backlit screen. Consequently, there exist local deviations of the light rays which pass in this zone, and the observer perceives the etching line even if the material is itself transparent, thus creating an undesirable optical effect.

Moreover, in certain optical configurations, the etching zones present on the zones of photovoltaic material will likewise be able to be seen. The change of index between two successive films of the stack may also be visible in each etching zone, either viewed directly, or through reflection at certain angles.

Having regard to the optical quality generally demanded by the screen industry, which envisages transparency rates of the order of 90% or more, the visibility of the etching lines which are due to the series placement of the photovoltaic cells is therefore also to be avoided.

AIMS OF THE INVENTION

Consequently, the general objective of the invention is to propose a semi-transparent photovoltaic mono cell structure which is devoid of the aforementioned drawbacks, as well as a process for fabricating said mono cell.

In particular, the aim of the invention is to propose a semi-transparent photovoltaic mono cell structure adapted to allow its satisfactory integration into screens of electronic devices, especially of cellular phones. This structure must then resolve the contradiction between the quality of the displayed image, therefore the requirement of high transparency to light, of the order of 80-90%, and that of electrical production of greater than 2 mW/cm$^2$ under illumination equivalent to 1 sun (AM 1.5 G), unaffected by shadowing problems.

SUBJECT OF THE INVENTION

In order to achieve the set aims, the subject of the invention is a photovoltaic mono cell, an apparatus using such a mono cell, and a process for fabricating such a mono cell, such as are defined in the claims. In particular, a first subject of the invention is a photovoltaic mono cell semitransparent to light comprising a plurality of photovoltaic active zones separated by transparency zones, said photovoltaic active zones being formed of a stack of thin films consisting at least of a transparent electrode, of an absorber film and of a metallic electrode which are arranged on a substrate transparent to light;

and said transparency zones being apertures made at least in the metallic electrode and in the absorber film to allow through a maximum of light;

characterized in that it furthermore comprises an electrically conducting collection gate (8) arranged either in contact with the front electrode (2) to reduce the electrical resistance of the transparent electrode (2), or in contact with the absorber (3) to facilitate the collection of the electric current generated by said mono cell.

A first principle of the invention consists in replacing the series placement of several photovoltaic cells by a mono cell, for the entire active conversion zone. A single photovoltaic cell, comprising thin films as one whole and comprising at least two electrically conducting films, namely a transparent electrode and a metallic electrode, and a semiconducting intermediate film able to form a photovoltaic diode, is called a photovoltaic mono cell. As will be seen in the detailed description, the effect of this arrangement is to at least partially solve the three problems mentioned hereinabove.

However, this mono cell-based design creates a new problem which may be penalizing at the electrical level. Indeed, the series electrical resistance of the transparent electrode limits the current produced by the mono cell. In order to resolve this parasitic effect, the invention provides for making rear-contact pickups, as will be described in conjunction with the figures. The invention provides for improving the collection of the electrical energy produced by the absorber film, through the addition of a collection line, or collection gate, which is more conducting than the constituent materials customarily used for the transparent electrode.

According to certain embodiments employed within the framework of the invention, the transparent electrode consists of graphene or of metallic nanostructures or else of a transparent conducting oxide such as $SnO_2$, ITO, IZO, AZO, BZO, GZO or ZnO. The metallic electrode is formed of a metal such as aluminum (Al), nickel (Ni), gold (Au), silver (Ag), copper (Cu), molybdenum (Mo), chromium (Cr), titanium (Ti) or palladium (Pd). The absorber film is composed of one or more inorganic and/or organic semi-conducting materials, for example based on amorphous or microcrystalline silicon, GaAs (gallium arsenide), CdTe (cadmium telluride), CIGS (copper—indium—gallium—selenium) or based on polymers. It may entail junctions of p-i-n or p-n type, or else tandem architectures, that is to say comprising several films of materials which preferentially absorb a different part of the luminous spectrum. They can be designed to convert visible light and/or ultraviolet light and/or infrared light into electricity. Advantageously, the choice of the semi-conducting materials is made so as to maximize the capture of photons in the illumination conditions envisaged.

The photovoltaic active zones can be of any shapes and of dimensions such that the human eye does not distinguish them. Accordingly, the width of the photovoltaic zones is preferably less than 200 micrometers. In a particular embodiment, the photovoltaic active zones or the transparency zones are organized into arrays of linear, circular or polygonal elementary geometric structures.

Preferably, in order to ensure a good degree of transparency upon the photovoltaic mono cell, the latter comprises transparency zones made in the films of the absorber and of the metallic electrode, in such a way that an observer situated in front of the substrate can see an image displayed behind the photovoltaic cell, these transparency zones being configured to leave photovoltaic active zones remaining between them. The transparency of the photovoltaic mono cell is dependent on the area fraction occupied by the opaque photovoltaic active zones. In an advantageous embodiment, the transparency zones are made in the transparent electrode in addition to the metallic electrode and the absorber film, so as to increase the transmission of light at the level of the transparency zones, since by reducing the number of interfaces, the optical phenomena of reflections at the interfaces are minimized.

In this manner, in contradistinction to the known photovoltaic modules having a similar size, there is no placement in series of individual cells of small size, typically of the order of less than a centimeter in width. Furthermore, the mono cell makes it possible to avoid most of the etchings of the films of the photovoltaic cell which would ultimately be visible and therefore prejudicial to the picture quality of an image associated with the photovoltaic module.

On the contrary the mono cell according to the invention forms a homogeneous zone substantially of the size of the photovoltaic module or of the associated image, this image being able to be arbitrary. For example it may be an active image of a backlit screen as in the case of cellular phones, touchpad tablets, or other devices with a backlit image. But it may also be a purely passive reflective image, as in the case of an electronic tag, of a bi-stable screen (as in the case of electronic paper termed "e-paper"), or even of a simple sheet of paper bearing a printed image.

The collection gate of the mono cell is electrically conducting and preferentially metallic so as to facilitate the collection of the electrical charges generated in the absorber film and transported by the transparent electrode of the mono cell. This collection gate therefore makes it possible to reduce the electrical resistance of the transparent electrode, which limits the electrical performance of the mono cell.

This collection gate can be produced in multiple ways. According to a first embodiment, certain photovoltaic active zones are substituted by a collection gate arranged on the transparent electrode between two adjacent photovoltaic active zones (cf. FIG. 8), the set of collection gates being linked electrically by a collection bus.

According to another advantageous embodiment, the photovoltaic active zones consist of absorber films and of metallic electrodes that are less wide than the transparent electrodes, and the collection gate consists of fine metallic strips arranged on the transparent electrode and situated square with the absorber film (cf. FIG. 10). These metal strips may be very fine and invisible to the naked eye, thereby making it possible to increase the homogeneity of appearance of the surface of the mono cell.

According to another variant embodiment, the collection gate is produced in the form of metallic caps arranged on a dielectric material surrounding the photovoltaic active zones formed of a stack of thin films (cf. FIG. 11).

According to an additional variant embodiment, the collection gate is arranged on the substrate before the production of the transparent electrode, so that said collection gate lies buried in the transparent electrode (cf. FIG. 12). In this case it may be beneficial for an antireflection film to be interposed between the substrate and the buried collection gate, so as to further reduce the visual impact of the buried collection gate.

It is also possible for the zones of the collection gate (8) to be arranged completely inside the transparent electrode film, under the photovoltaic active zones and set back with respect to the interface with the substrate (cf. FIG. 13). In this case, according to an advantageous variant, the constituent zones of the collection gate have a smaller width than the width of the photovoltaic active zones, so that the collection gate limits the shadowing of the ambient light so as to maximize the generation of current by the photovoltaic active zones (cf. FIG. 14). For example, the zones of the collection gate have a width of the order of a micrometer and are situated in the transparent electrode under the photovoltaic active zones, so that the bands of the collection gate are invisible to an observer placed in front of the substrate of the module.

Alternatively, the collection gate is directly inside the absorber film.

Advantageously, to minimize the visual impact of the collection gate, said collection gate has the shape of an inverted T arranged on certain photovoltaic active zones, in such a way that only a small area of the collection gate corresponding to the base of the inverted T comes into contact with the transparent electrode (cf. FIG. 9). This reduces the visual impact of the collection gate, but the corresponding collection zone surface is lost, since the current-producing zone is then shunted.

In order to remedy this, provision may be made for the interface zones between the inverted T-shaped metallic bands and the photovoltaic active zones to be passivated with the aid of an electrical insulant, the collection gate then being deposited on the passivation film. The same reduction as beforehand is obtained in the visual impact of the collection gate, but the corresponding photovoltaic active zone is kept in an operative state. In this embodiment, said photovoltaic active zones contain several channels, made in the metallic electrode and the absorber film and at the level of which an electrically conducting collection gate is in contact with the transparent electrode, said collection gate being separated from the metallic electrode and from the absorber film by a dielectric material, so as to reduce the electrical resistance of the transparent electrode while minimizing the visibility of the collection gate (cf. FIG. 17).

The number of channels made in the photovoltaic active zones, as well as the contact surface between the collection gate and the transparent electrode are tailored so as to minimize the series electrical resistance of the mono cell while reducing to the maximum the optical effects, undesirable for the observer, which are due to the presence of this collection gate. The person skilled in the art will know how to adapt the density of the channels and the size of the collection gates as a function of the intrinsic electrical resistance of the transparent electrode and as a function of the electric current that the photovoltaic mono cell must provide in the envisaged application.

The collection gate is separated from the absorber film and from the metallic electrode which delimit the channels by a film of dielectric material which electrically insulates the collection gate from these thin films, so as to eliminate any possibility of short-circuit, which would bring about a degradation of the electrical performance of the mono cell.

The collection gates arranged in the set of channels are linked together electrically by a collection bus of the front face which is electrically insulated from the collection bus of the rear face which electrically links the metallic electrodes.

The electrical insulation between the two buses can be produced with the aid of the dielectric material previously described. Moreover, the dielectric material can, in certain embodiments, be deposited in a single step and thus cover the transparency zones. The dielectric material is therefore advantageously transparent or semi-transparent to visible light so as not to reduce the transmission of light through said transparency zones. Furthermore, the refractive index of the dielectric material advantageously lies between the refractive index of the transparent substrate or of the transparent electrode and that of the air or of a transparent optical glue, so as to reduce the optical phenomena of reflections at the interfaces and to increase the transmission of light at the level of the transparency zones.

According to various embodiments, the transparent substrate can consist of a solid material such as mineral glass, organic glass or else a polymer of PMMA, PET or polycarbonate type, and can be rigid or flexible.

In a particular embodiment, not represented, the transparent substrate is covered with a, for example, antireflection or anti-UV functional surface.

The subject of the invention is also any apparatus using one or more mono cells described here.

Another subject of the invention relates to the process for fabricating such a semi-transparent photovoltaic mono cell, in which process:
- a mono cell semi-transparent to light comprising a plurality of photovoltaic active zones separated by transparency zones is supplied;
- channels are made in the photovoltaic active zones by etching or ablation of the constituent materials of the metallic electrode and of the absorber film;
- a dielectric material is deposited around the non-etched photovoltaic active zones while leaving visible a zone of the transparent electrode at the level of the channels;
- a collection gate is deposited, as are the collection buses of the front face and of the rear face.

FIGURES

The invention will be better understood with the aid of its detailed description, in conjunction with the figures, in which.

Figure 17A:
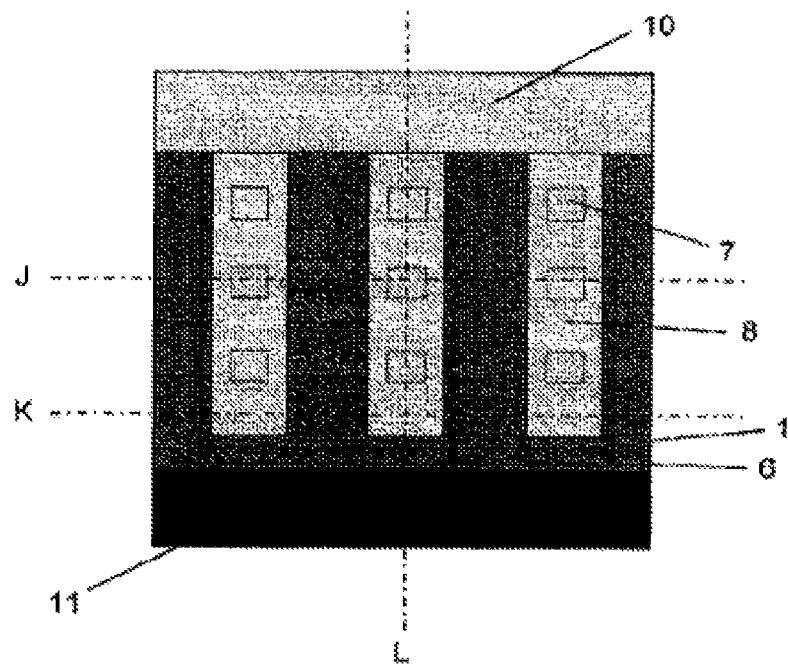
FIGS. 17a, 17b and 17c illustrate respectively an end-on view and two cross-sectional views of another photovoltaic mono cell according to the invention.
Figure 17B:
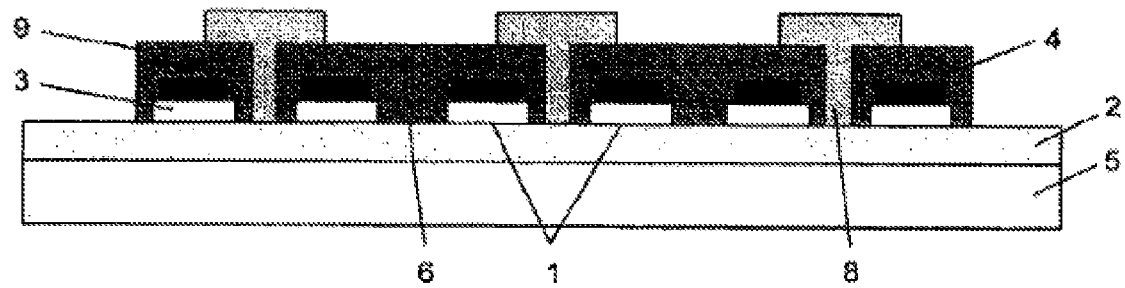
Figure 17C:
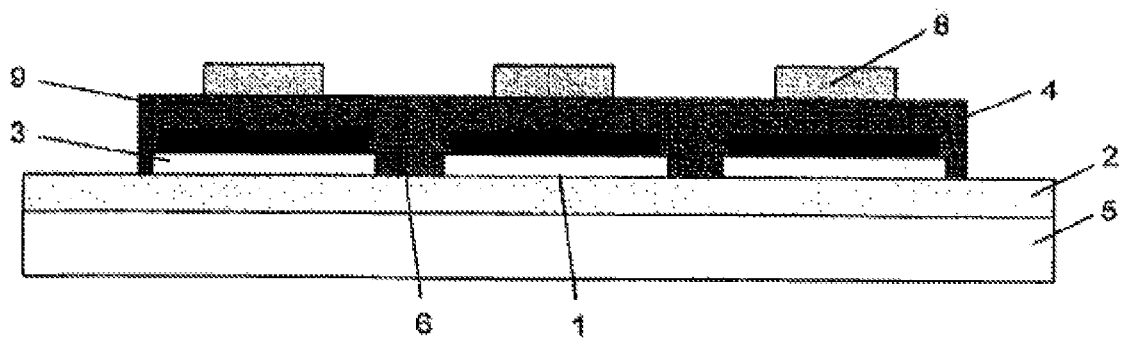

FIGS. 18a, 18b, 18c and 18d schematically show in cross section objects which illustrate various intermediate steps of a process for fabricating the photovoltaic mono cell represented in FIGS. 17a to 17c.

The figures are not to scale, the relative thicknesses of the components of the mono cell being intentionally exaggerated in order to better reveal its structure.

DETAILED DESCRIPTION

Figure 1:
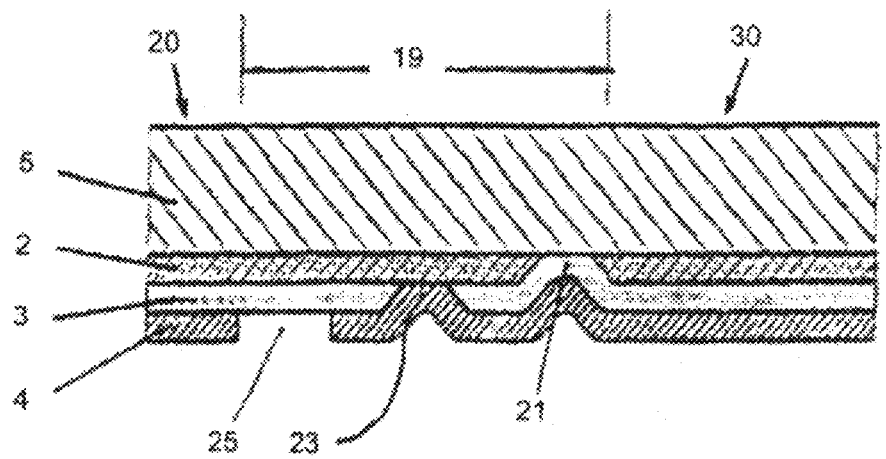
FIG. 1 is a cross-sectional view of two adjacent photovoltaic cells connected in series in a conventional multicellular photovoltaic module, such as described in the document EP0500451-B1 forming part of the prior art.
Figure 7:
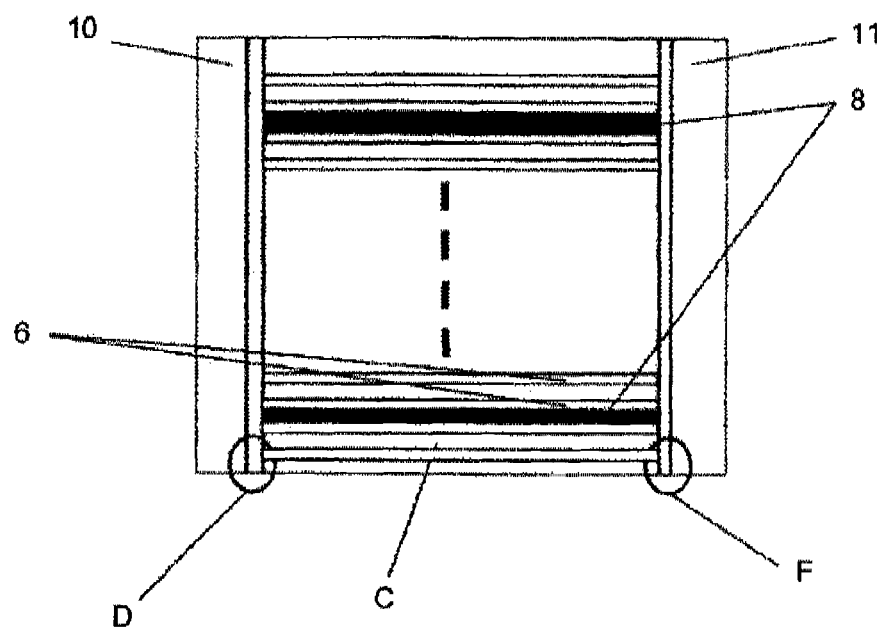
FIG. 7 is a plan view of the photovoltaic mono cell of FIG. 6, provided furthermore with a collection gate.

Referring to FIG. 1, which is a reproduction of FIG. 7 of patent document EP0500451-B1 mentioned previously. The numerical references of this figure are such as they appear in said document. The photovoltaic module comprises two adjacent photovoltaic cells 20, 30 linked together by an interconnection zone 19 consisting of three parallel and substantially adjacent zones: a zone 21 of interruption of the transparent electrode 2, which corresponds to the etching termed P1, where the photovoltaic absorber film 3 of a cell comes directly into contact with the substrate 5; a piercing or interruption zone 23 which corresponds to the etching termed P2 of this same semi-conducting film, where the metallic electrode 4 comes directly into contact with the transparent electrode 2 of the neighboring cell 20, and then another zone of interruption 25 of the metallic electrode, which corresponds to the etching termed P3.

The semi-transparency of this known module is ensured by transparent bands perpendicular to the series interconnection zones 19, cut by etching, and then reconnected together by contact pickups.

Figure 3:
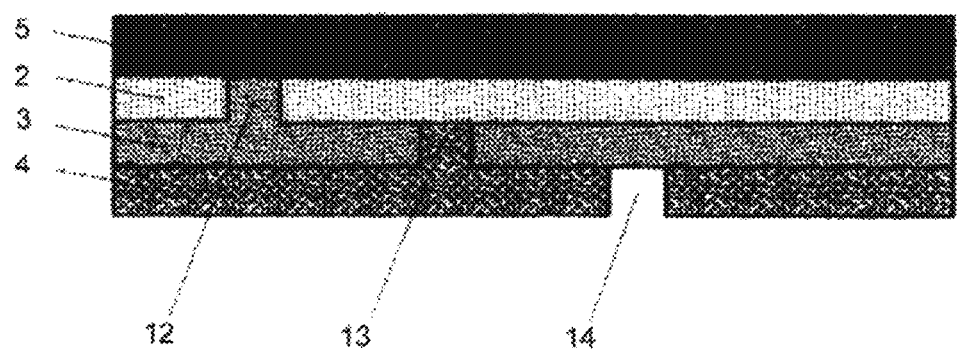
FIG. 3 is a detail schematic view of the module according to FIG. 1 and FIG. 2, namely a cross-sectional view of the connection zone E between two adjacent cells of the photovoltaic module.

A more schematic view of this known structure of FIG. 1 has been represented in FIG. 3 with numerical references which will be reused in the subsequent description. The structure is composed of a glass substrate referenced 5, and of a stack of thin films (2,3,4). The index 2 represents a transparent conducting film, constituting the transparent electrode. The index 3 represents the photovoltaic absorber film, typically doped silicon, as known per se. The index 4 represents a conducting film, typically metallic, constituting the metallic electrode.

At 12 an insulation line of the transparent electrode 2 has been represented. It is obtained by the etching P1 and makes it possible to electrically insulate the front electrodes of two adjacent cells. At 13 the insulation line of the absorber has been represented. It is obtained by the etching P2 and makes it possible to electrically insulate the absorbers of two adjacent cells. At 14 the insulation line of the metallic electrode 4 has been represented. It is obtained by the etching P3 and makes it possible to electrically insulate the metallic electrodes of two adjacent cells.

Figure 2:
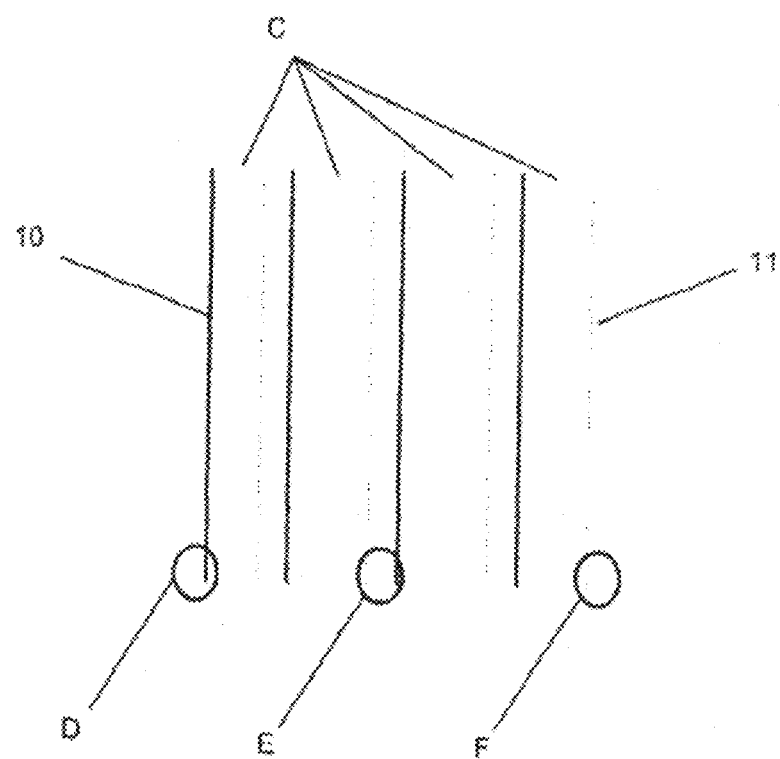
FIG. 2 is a schematic view from above of a known photovoltaic module of FIG. 1.

A schematic plan view of a photovoltaic module according to FIG. 3 has been represented in FIG. 2. The various etching lines corresponding to the etchings P1, P2 and P3 are visible, to diverse degrees, as a function of the depth at which they are produced with respect to the surface of the substrate. Thus, the reference 10 indicates the connection buses, one of the buses being connected to the anode and the other to the cathode. The reference C indicates several photovoltaic cells placed in series. D E and F indicate the traces of laser or chemical cutting which are visible from the top by transparency, and which correspond respectively to the etching lines produced in the various films.

The zones which are the most visible in reality consist of the etchings corresponding to the zones E of FIG. 3, which correspond to the zones in which elementary photovoltaic cells are placed in series. But also seen are the etchings D,F corresponding to the buses for connection of the anodes and cathodes of the module.

What is seen the most in the zone E of series placement of elementary cells is the metallic contact 13 (FIG. 3) which corresponds to the placing in series of two neighboring cells (metal on conducting transparent film).

Also seen is the line 12 corresponding to the etching of the transparent electrode 2, because of the jump of index in the stack, since one passes directly from an index of 1.5 of the glass substrate 5, to an index of 3.5 for the silicon of the absorber 3, therefore the luminous reflection on the etching line 12 will be more strong and visible.

For the insulation line 14 of the metallic electrode 4, there is a break in optical continuity, since the hole in the opaque metal of the metallic electrode 4 allows through the residual light not guided by the optical system of the module, in the case where the photovoltaic module uses such an optical system to guide the light.

Figure 4:
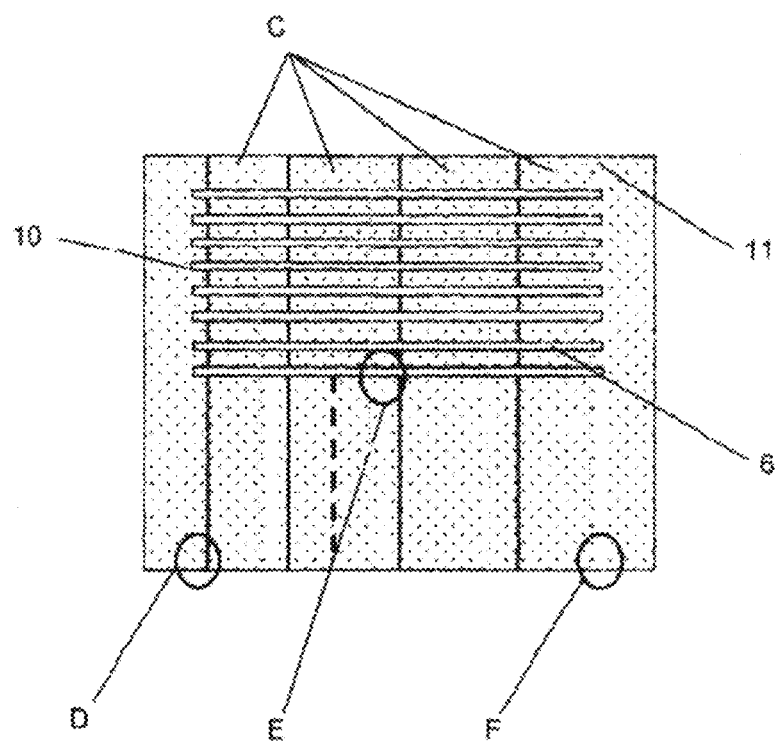
FIG. 4 is a schematic plan view of a multicellular and semi-transparent photovoltaic module according to the prior art.

FIG. 4 is a view similar to that of FIG. 2, but supplemented with transparency zones 6, produced here in the form of transparency bands cut, for example by laser etching, in the electrode and absorber films.

The presence of the transparency bands leaves the etching planes P1, P2, P3 still visible as explained above, but etching lines are now seen (dashed line). The set of these etching traces (12,13,14) of the zone of placement in series E is visible and disturbs the picture quality of an image which would be arranged under the photovoltaic module, so that this known module type cannot be validly integrated into an electronic device of the cellular phone type, since the negative impact of these traces on the visibility of the image on the screen would be too harmful.

Figure 5:
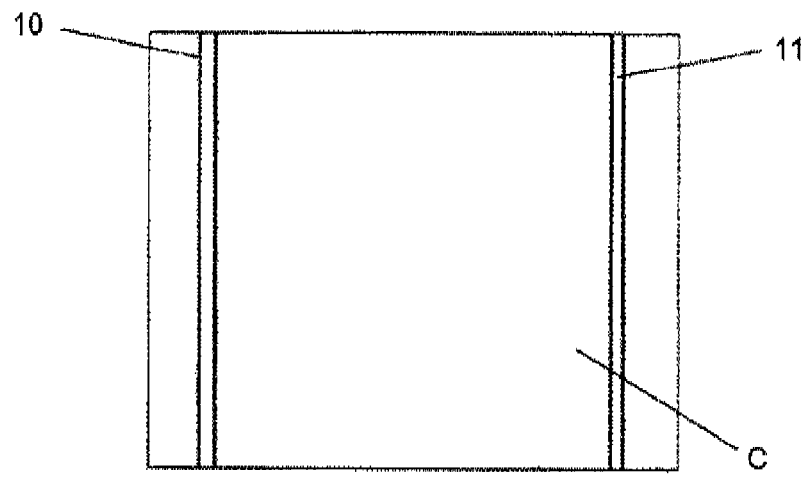
FIG. 5 is a plan view of a photovoltaic mono cell according to the invention, represented before the production of transparency zones.
Figure 6:
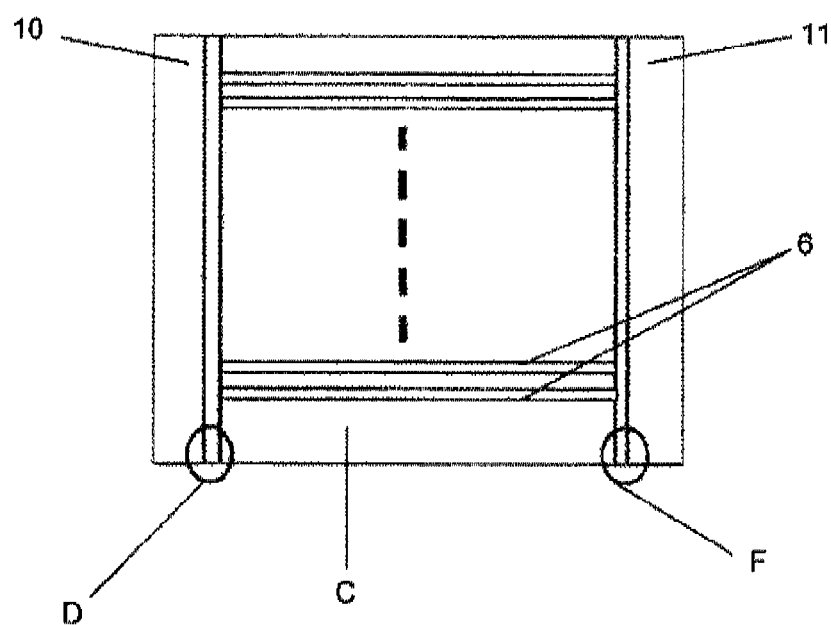
FIG. 6 is a plan view of the photovoltaic mono cell according to FIG. 5, provided with its transparency zones.

We now refer to FIGS. 5 and 6 to describe the principle of the invention calling upon a single photovoltaic cell, the so-called mono cell, able to cover the whole of the useful surface of a device, for example the screen of an electronic display device, such as for example a cellular phone.

In FIG. 5 a mono cell has been represented viewed from above, before production of the transparency zones 6. As is seen, production consists of one single photovoltaic cell as one whole C. It is delimited on its sides by connection buses (10,11), which are in contact, the one, with the transparent electrode 2 and, the other, with the metallic electrode 4, and whose laser etching scorings D,F are depicted in plan view (FIG. 6). In this configuration, in contradistinction to the known photovoltaic modules described with reference to FIGS. 1 to 4, there is now no connection zone for placing multiple cells in series, since there is now only a single photovoltaic cell of large size, in place of a multitude of small elementary cells connected in series.

In FIG. 6 the same plan view of the photovoltaic mono cell of FIG. 5 has been represented, but after production in the cell, typically opaque, of a set of transparency zones 6. These transparency zones 6 are for example produced by cutting regular bands, especially with the aid of a laser beam etching process. The transparency zones or bands 6 are preferably regularly spaced. For an image to which the observer is close, the transparency bands and/or the photovoltaic active bands are typically spaced apart by a distance of less than about a hundred micrometers. For an image from which the observer is further away, the transparency bands and/or the photovoltaic active bands are preferably spaced apart by a distance of less than a millimeter.

Figure 8:
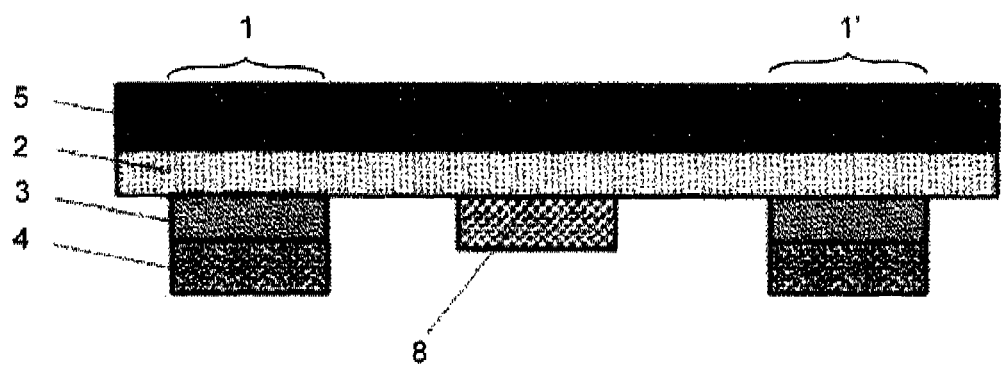
FIGS. 8 to 11 are cross-sectional views showing four embodiments of the collection gate of the photovoltaic mono cell according to the invention.

According to an advantageous embodiment of the photovoltaic mono cell according to the invention, certain transparency zones 6 can be replaced, at preferably regular intervals, by a conducting collection gate 8, as represented in plan view in FIG. 7, and in sectional view in FIG. 8. It is much more conducting than the constituent material of the transparent electrode 2 and makes it possible to reduce the series resistance of said transparent electrode 2. The collection gate 8 operates as an electrical shunt placed on the transparent electrode 2. It is made for example of aluminum, n-doped or p-doped silicon, silver or other highly electrically conducting substance.

As seen in FIG. 8, the collection gate 8 is positioned on the transparent electrode after removal of the absorber film 3 which was there. Between the collection gate 8 and the adjacent absorber zones 3 are the transparency zones 6, which correspond to the zones in which the absorber film 3 and that of the metallic electrode 4 have been removed, especially by laser etching, chemical etching or plasma etching. The current-collecting zones consist of the remainder of the stacks of absorber zones and of the remainders of metallic electrode which surmount them.

Several possible variants for the production of such a collection gate 8 will be described in conjunction with the subsequent figures.

In FIG. 8, the interface between the collection gate 8 and the transparent electrode 2, which is metallic and shiny, may be visible to the observer when viewed from above, and this may be detrimental to the visual appearance of the device in which the photovoltaic module is liable to be incorporated. One way of solving this problem consists in interposing a non-reflecting element (not represented) between the collection gate 8 and the transparent electrode 2.

Figure 9:
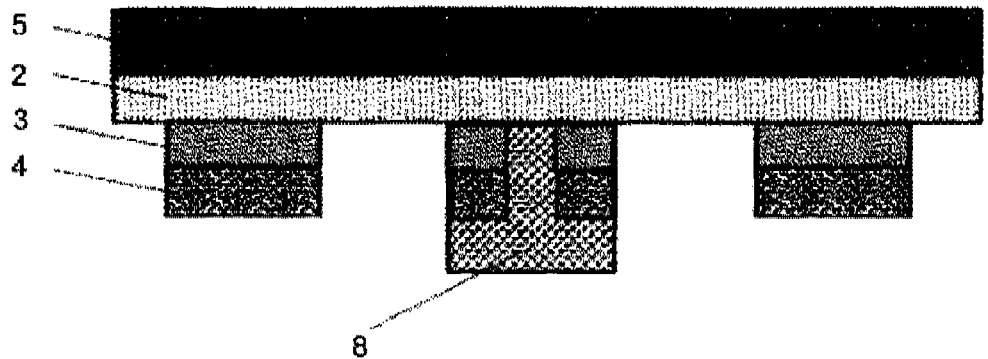

Another solution consists in minimizing the visible size of the collection gate 8, as represented in FIG. 9, in which the collection gate 8 possesses an inverted T shape, so that the base of the T is situated at the interface with the transparent electrode 2. Thus, the metallic surface of the collection gate 8 which is visible when viewed from above, is reduced, although the volume of the collection gate 8, and therefore its electrical conduction capacity, is unchanged with respect to FIG. 8.

Figure 10:
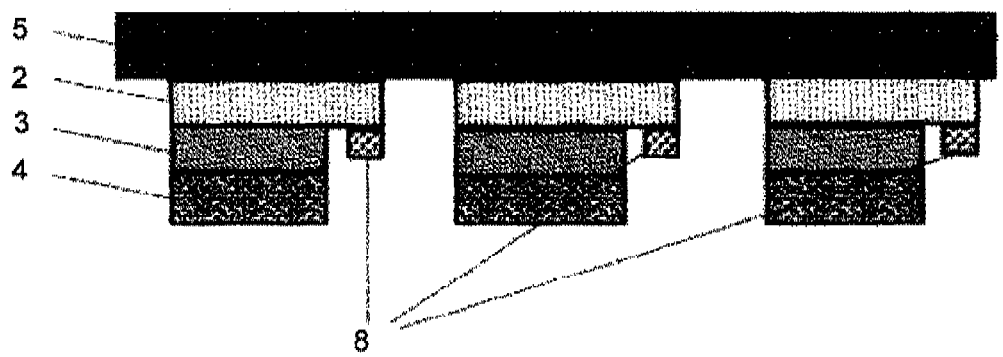

FIG. 10 represents yet another variant embodiment of the collection gate 8, in which the optical optimization of the visibility of the collection gate is obtained by another means. Rather than creating a fairly wide collection gate in place of certain absorber bands 3, a finer collection gate 8 is produced on the transparent electrode 2, square with each of the photovoltaic absorber films 3. Of course, the person skilled in the art will know how to adapt the density of the collection gate 8 lines as a function of the intrinsic electrical resistance of the transparent electrode 2 and as a function of the electric current that the photovoltaic cell must provide in the envisaged application.

Figure 11:
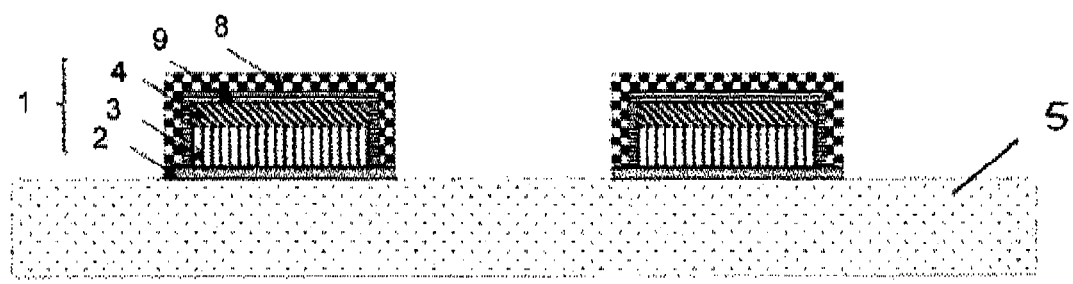

Another variant of collection gate 8 is represented in FIG. 11. This structure exhibits photovoltaic active zones 1 produced in a photovoltaic cell, and resting on a transparent substrate 5. The photovoltaic active zones 1 are composed of a transparent electrode 2, of an absorber film 3 and of a metallic electrode 4. A dielectric material 9 (oxide, nitride, polymer, etc.) shrouds the films (3,4) in the manner of a cap, over the entire length of the photovoltaic active bands 1. A conducting material, ideally metallic (copper, aluminum, silver, etc.), is deposited above the dielectric material 9, also over the entire length of the bands 1. Electrical contact thus exists between the metallic material 8 and the transparent electrode 2 of the photovoltaic cell. However, no electrical contact exists between this same metallic material 8 and the other films (3,4) of which the photovoltaic cell is composed. In this variant, the material 8 plays the role of a metallic collection gate 8 which collects the electrons flowing in the transparent electrode 2 of the photovoltaic cell. This structure exhibits the advantage of decreasing the series electrical resistance of the cell by virtue of the reduction in the electrical path traveled by the electrons in the transparent electrode 2, composed of a generally more resistive conducting transparent material. The film 8 can also play the role of a reflector of light which increases the energy efficiency of the cell. It should be noted that the transparent electrode 2 can be common to all the photovoltaic active bands 1. A transparent electrode 2 pooled for the set of photovoltaic active bands 1 is then obtained.

Another way of proceeding consists in producing a collection gate no longer arranged in relief on the transparent electrode of the transparent electrode, but to bury the collection gate inside the transparent electrode of the transparent electrode, as represented in the variants of FIGS. 12 to 15.

Figure 12:
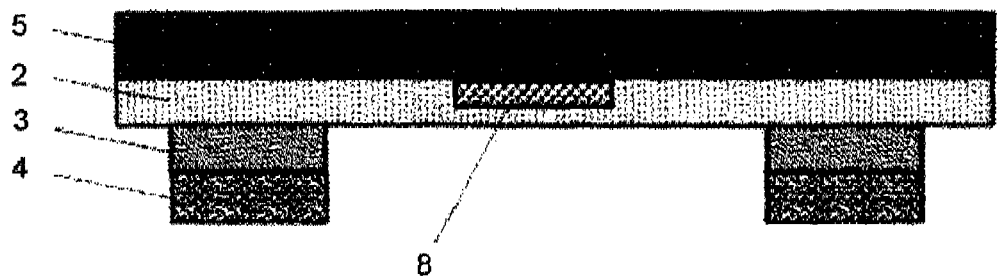
FIGS. 12 to 15 are cross-sectional views of other embodiments, in which the collection gate is buried either in the film of the transparent electrode of the photovoltaic mono cell, or in the absorber film.
Figure 13:
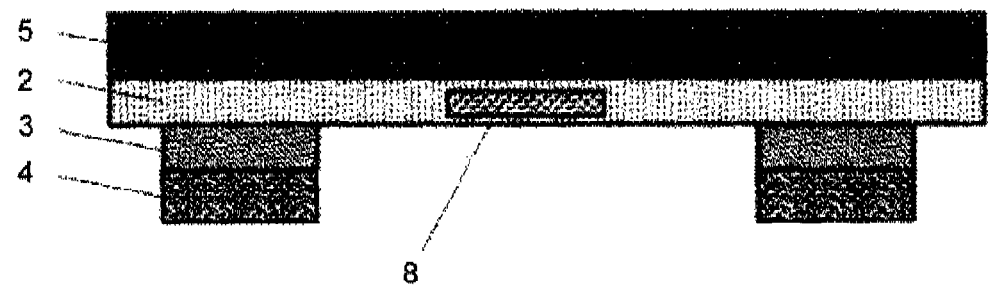

In FIG. 12, a collection gate 8 is buried in the transparent electrode 2 between two adjacent photovoltaic active bands. But having regard to the transparency of the glass substrate 5 and of the transparent electrode 2, if the collection gate 8 is a little too wide, it may happen that its metallic reflection is still visible in transparency through the glass and the transparent conducting material which covers it. This can be attenuated by interposing an antireflection film (not represented) between the glass and the collection gate 8.

Figure 14:
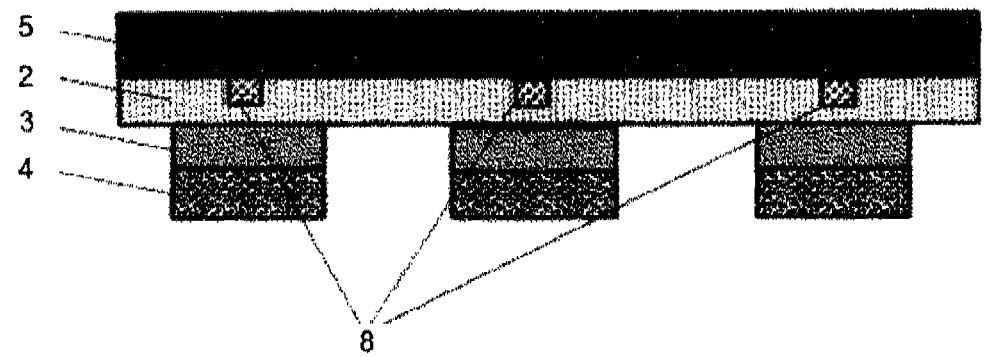

Another variant represented in FIG. 14 consists in producing the collection gate 8 in the form of a set of fine conducting lines 8, each line having a smaller width than the width of the collection zone consisting of the stack (3,4), and being arranged in the transparent electrode 2, opposite a corresponding line of the absorber 3. As the absorber 3 and the collection gate 8 have a similar brilliance, the collection gate will not add any further visual disturbance. Moreover, the absorber 3 lines will be almost invisible, because they constitute an array of regularly spaced lines.

Although the conducting line formed by the collection gate 8 will create a loss of photovoltaic collection surface in comparison with a solution without a collection gate 8, the loss will in certain cases be sufficiently low for this to be beneficial with respect to the loss induced by the transparent conducting material. Indeed, at low illumination (~1000 lux), the influence of the series electrical resistance on the power generated is not noticeable, therefore the benefit of the collection gate is low or indeed zero. On the other hand, in the case of strong illumination (~0.5 SUN i.e. about 50 000 lux), the series resistance of the transparent electrode 2 is heavily penalizing (i.e. a power loss of the order of 50%). Thus the collection gate causes the loss of a small part of the photovoltaic active surface either through shadowing, or through a decrease in the active surface, but on the other hand it makes it possible to utilize the whole of the potential of the photovoltaic diode. Therefore, at strong illumination the collection gate 8 definitely gains on the electrical power produced.

Another advantage of this variant is that a standard supply of the absorber material is retained and that there is no need to etch the transparent electrode. Moreover the transparent electrode can be very fine (of the order of a few tens of nanometers), thereby making it possible to preserve a high transparency of the module between the collection zones.

It should be noted that the variants with collection gate 8 buried in the transparent electrode 2 have additional advantages from the point of view of the fabrication efficiency. Indeed, when the collection gate 8 is inserted under the transparent electrode and between the absorber bands as represented in FIGS. 8 to 11, it is produced as the last step. Now, this is a step having a very high loss rate, possibly up to 90% of waste. To limit the losses it is possible to produce the collection gate 8 either directly on the glass substrate before the deposition of the films constituting the absorber (FIGS. 12,14), or even inside the transparent electrode 2 (FIG. 13), or even without a transparent electrode (FIG. 15).

The first option seems to be the more economically beneficial. Indeed, if fabrication defects appear during the production of the collection gate 8, it is very simple to rework the dies at very low cost. Moreover the buried collection gate offers a large gamut of possible fabrication processes for the production of the metallic contact pickup of the collection gate 8 on the transparent electrode 2, especially as regards the temperature ranges, with no risk of deterioration of the absorber films 3 since the latter are not yet deposited during the production of the collection gate/transparent electrode contact pickup.

Figure 15:
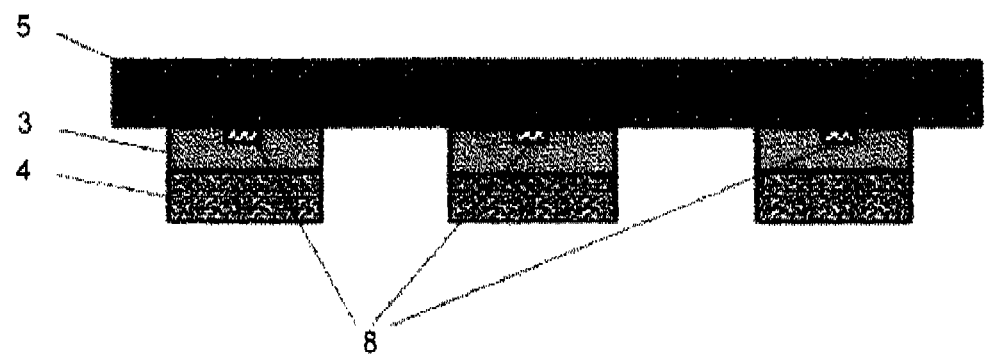

FIG. 15 is similar to FIG. 14, but the transparent electrode has been removed: the collection bands 8 are sufficiently fine for the conductivity of the absorber 3 to suffice to collect the electrons directly toward the collection gate 8, without the aid of a transparent conducting material.

Figure 16:
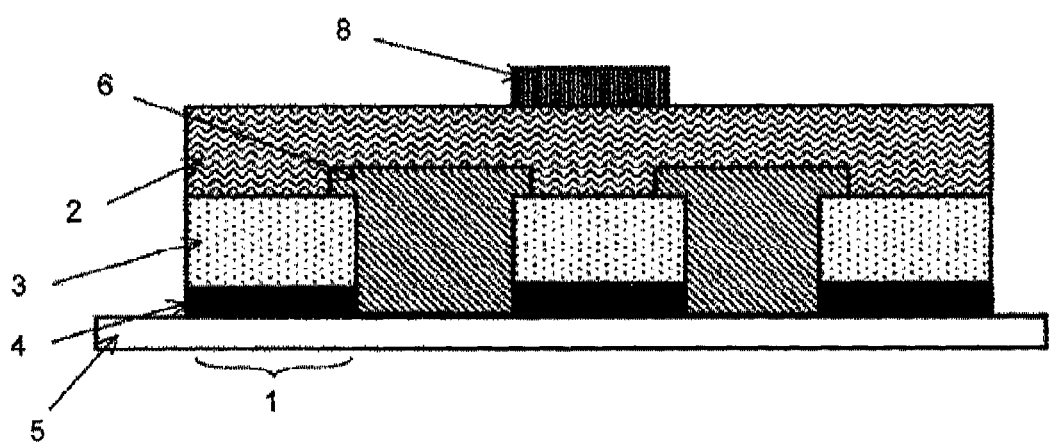
FIG. 16 is a cross-sectional view of an embodiment using another type of photovoltaic diode with a different stack of thin films from the stacks of FIGS. 8 to 15.

In FIG. 16 a structure which is a variant of those of FIG. 8, 14 or 15 has been represented, in which the mono cell comprises an absorber 3 which is a material of CIGS (Copper, Indium, Gallium, Selenium) type. The stack of thin films (2,3,4) is then inverted and forms a P-N junction. In this case it is necessary to interpose a transparent electrical insulant 9, also called a transparent dielectric, between the photovoltaic active zones 1. But this shows in particular that the invention, using a photovoltaic mono cell, can readily be adapted to various absorber materials, and is definitely independent of the photon capture technique used.

We now refer to FIG. 17, which illustrates an end-on view of another photovoltaic mono cell according to the invention (FIG. 17*a*) and two cross sections of said mono cell viewed along the axis J (FIG. 17*b*) or along the axis K (FIG. 17*c*), the two axes being defined in FIG. 17*a*.

The mono cell is composed of three photovoltaic active bands 1, themselves consisting of three thin films, namely a transparent electrode 2, an absorber film 3 and a metallic electrode 4. These photovoltaic active bands 1 are separated by free bands 6 corresponding to transparency zones at the level of which the absorber film 3 and the metallic electrode 4 have been etched. The photovoltaic active bands 1 contain a plurality of channels 7 which are also apertures made in these photovoltaic active bands 1 by etching of the absorber film 3 and of the metallic electrode 4.

These channels 7 make it possible to place the transparent electrode 2 in electrical contact with an electrically conducting collection gate 6 so as to reduce the intrinsic resistance of the transparent electrode 2 while minimizing the visibility of this gate 6. However, so as not to reduce the electrical performance of the mono cell, the collection gate 6 is separated from the metallic electrode 4 and from the absorber film 3 of the photovoltaic active bands 1 by a dielectric material 9.

The set of collection gates 8 situated on each photovoltaic active band 1 is linked at the periphery of the mono cell to a collection bus of the front face 10 which makes it possible to collect the electrical charges transported up to the transparent electrode 2. Opposite this collection bus of the front face 10 is a collection bus of the rear face 11 which makes it possible to link the metallic electrodes 4 of each photovoltaic active band 1 and thus to collect the charges transported up to said metallic electrodes 4.

FIG. 18 schematically shows in cross section objects which illustrate various steps of a process according to the invention, the sectional views being carried out at the level of the photovoltaic active bands 1, along the axis L defined in FIG. 17*a*.

In a first step (FIG. 18*a*), a mono cell semi-transparent to light comprising a plurality of photovoltaic active zones 1 separated by transparency zones 6 is supplied. The photovoltaic active zones 1 comprise at their periphery, at the level of the electrical connection zones, several zones of interruption of the thin films (2,3,4), generally parallel:

a first zone of interruption of the transparent electrode 2, which corresponds to the etching termed P1, where the absorber film 3 comes directly into contact with the substrate 5;

a second zone of interruption of the absorber film 3, which corresponds to the etching termed P2, where the rear electrode 4 comes directly into contact with the front electrode 2;

a third zone of interruption of the rear electrode 4, which corresponds to the etching termed P3.

In a second step (FIG. 18*b*), channels 7 are made in the photovoltaic active zones 1 by successive etchings of the constituent materials of the metallic electrode 4 and of the absorber film 3. These etchings can be carried out wet or dry with the aid of a photo-lithography process, nano-imprint process or else directly by laser ablation. The photo-lithography and nano-imprint steps (not represented in the figure) are known to the person skilled in the art and consist in depositing a non-permanent, photosensitive or thermosensitive resin according to a predefined pattern before etching, and then in dissolving said resin at the end of the process. The etchings can be carried out with the aid of a solution adapted for dissolving the materials of the films 3 and 4, or with the aid of a plasma or else by laser.

In a third step (FIG. 18*c*), a dielectric material 9 is deposited around the non-etched photovoltaic active zones while leaving visible a zone of the transparent electrode 2 at the level of the channels 7. The process used in this step is typically a photolithography process, in which the dielectric material 9 is a permanent resin, preferably transparent, developed according to the desired pattern.

Figure 18A:
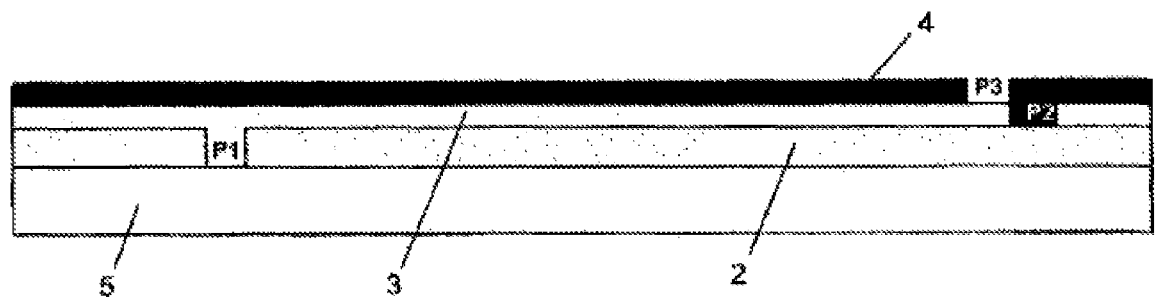
Figure 18B:
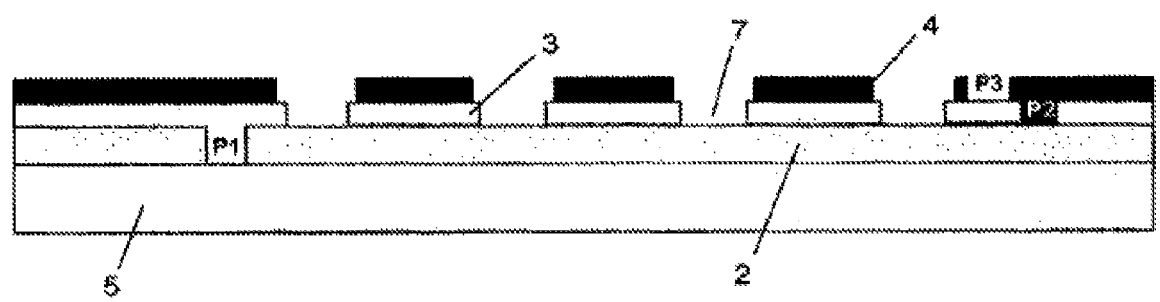
Figure 18C:
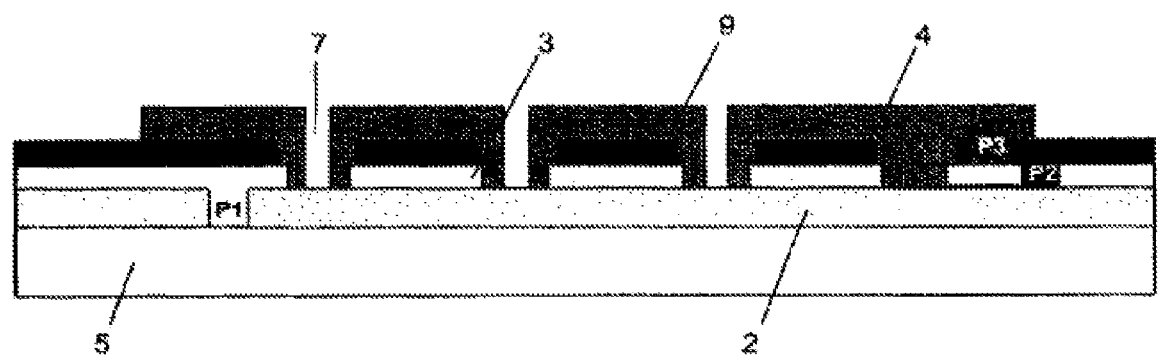
Figure 18D:
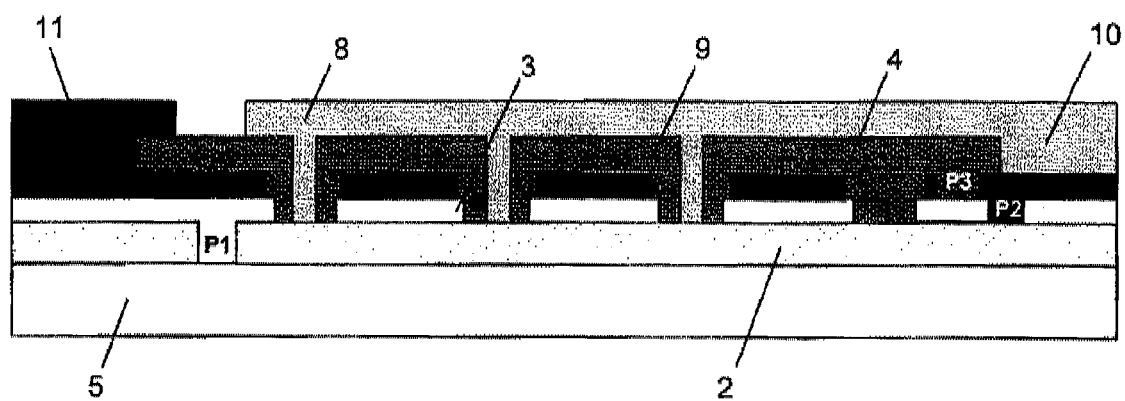

Finally, the last step (FIG. 18*d*) consists in depositing the collection gate 8, as well as the collection buses (10,11) of the front face and of the rear face so as to obtain the semi-transparent photovoltaic mono cell according to the invention. The deposition of an electrically conducting material, such as a metal, can be carried out on the whole of the mono cell so as to fill in the previously etched zones, before electrically insulating by photolithography and etching the collection bus of the rear face 11 of the collection gate 8 and revealing the transparency zones (FIG. 18*a*).

ADVANTAGES OF THE INVENTION

The photovoltaic mono cell according to the invention makes it possible to achieve the envisaged aims. By virtue of its design, there is no longer any etching for placing in series in the active zone, nor any problem of shadowing of an elementary cell, nor any loss of surface area related to the etchings for placing in series.

The photovoltaic cell according to the invention therefore makes it possible to obtain at one and the same time good optical homogeneity, improved electrical performance, and optimal useful production surface area.

The techniques for fabricating such a cell remain standard, by deposition of films, lithography and etching, on standard hardware.

| List of labels used in the figures | |
|---|---|
| 1 | Photovoltaic active zone |
| 2 | Transparent electrode |
| 3 | Absorber film |
| 4 | Metallic electrode |
| 5 | Transparent substrate |
| 6 | Transparency zone |
| 7 | Channel |
| 8 | Collection gate |
| 9 | Dielectric material |
| 10 | Collection bus of the front face |
| 11 | Collection bus of the rear face |
| 12 | Etching line of the transparent electrode (etching P1) |
| 13 | Etching line of the absorber (etching P2) |
| 14 | Etching line of the metallic electrode (etching P3) |
| 20, 30 | Adjacent photovoltaic cells |
| 21 | Zone of interruption of the transparent electrode (etching P1) |
| 23 | Zone of interruption of the absorber (etching P2) |
| 25 | Zone of interruption of the metallic electrode (etching P3) |

The invention claimed is:

1. A photovoltaic mono cell semi-transparent to light, comprising:
a plurality of photovoltaic active zones separated by transparency zones,
said photovoltaic active zones being formed of a stack of thin films comprising a transparent electrode, an absorber film and a metallic electrode which are arranged in the stated order, from a first side of the stack to a second side of the stack, on a substrate transparent to light, such that the first side of the stack is closest to the substrate;
and said transparency zones being apertures made at least in the metallic electrode and in the absorber film to allow through light;
an electrically conducting collection gate arranged in contact with the transparent electrode to reduce its electrical resistance and avoid direct physical or electrical contact with the metallic electrode,
a first collection bus linked to the collection gate to collect electrical charges from the transparent electrode; and
a second collection bus linked to the metallic electrode, the second collection bus spaced apart from the first collection bus,
wherein said photovoltaic active zones furthermore contain several channels, made in the metallic electrode and the absorber film, said collection gate being separated from the metallic electrode and from the absorber film by a dielectric material, so as to reduce the series resistance of the transparent electrode while minimizing the visibility of the collection gate,
wherein the collection gate substantially covers the photovoltaic active zones.

2. The photovoltaic mono cell as claimed in claim 1, wherein the apertures are in the form of discontinuous or non-discontinuous rectilinear bands, or according to any other shapes, said collection gate being adapted to said apertures so as to limit visibility of said collection gate.

3. The photovoltaic mono cell as claimed in claim 1, wherein the absorber films and the metallic electrodes are less wide than the transparent electrodes, and the collection gate comprises fine metallic strips arranged on the transparent electrode and situated aligned with the absorber film.

4. The photovoltaic mono cell as claimed in claim 1, wherein said collection gate is metallic.

5. The photovoltaic mono cell as claimed in claim 1, wherein said dielectric material is transparent or semi-transparent to visible light.

6. The photovoltaic mono cell as claimed in claim 1, wherein the refractive index of the dielectric material lies between the refractive index of the transparent substrate or of the transparent electrode and that of the air.

7. The photovoltaic mono cell as claimed in claim 1, wherein the refractive index of the dielectric material lies between the refractive index of the transparent substrate or of the transparent electrode and that of a transparent optical glue which forms part of the photovoltaic mono cell.

8. The photovoltaic mono cell as claimed in claim 1, wherein said photovoltaic active zones or the transparency zones are organized into arrays of linear, circular or polygonal elementary geometric structures.

9. The photovoltaic mono cell as claimed in claim 1, wherein said transparent electrode comprises graphene or metallic nanostructures or a transparent conducting oxide such as SnO2, ITO, IZO, AZO, BZO, GZO or ZnO.

10. The photovoltaic mono cell as claimed in claim 1, wherein said absorber film comprises one or more inorganic and/or organic semi-conducting materials, based on amorphous or microcrystalline silicon, GaAs (gallium arsenide), CdTe (cadmium telluride), CIGS (copper-indium-gallium-selenium) or based on polymers.

11. The photovoltaic mono cell as claimed in claim 1, wherein said metallic electrode comprises a metal such as aluminum (Al), nickel (Ni), gold (Au), silver (Ag), copper (Cu), molybdenum (Mo), chromium (Cr), titanium (Ti) or palladium (Pd).

12. The photovoltaic mono cell as claimed in claim 1, wherein the transparent substrate comprises a solid material made of mineral glass, organic glass or else a polymer of PMMA, PET or polycarbonate type.

13. The photovoltaic mono cell as claimed in claim 1, wherein the transparent substrate is covered with an antireflection or anti-UV functional surface.

14. A photovoltaic mono cell semi-transparent to light, comprising:
a plurality of photovoltaic active zones separated by transparency zones,
said photovoltaic active zones being formed of a stack of thin films comprising a transparent electrode, an absorber film and a metallic electrode which are arranged in the stated order, from a first side of the stack to a second side of the stack, on a substrate transparent to light, such that the first side of the stack is closest to the substrate and the transparent electrode is in contact with the substrate;
and said transparency zones being apertures made at least in the metallic electrode and in the absorber film to allow through light;

an electrically conducting collection gate arranged to avoid direct physical or electrical contact with the metallic electrode and positioned either in contact with the transparent electrode to reduce its electrical resistance, or in contact with the absorber to facilitate the collection of electric current generated by said mono cell, a first collection bus linked to the collection gate to collect electrical charges from the transparent electrode; and a second collection bus linked to the metallic electrode, the second collection bus spaced apart from the first collection bus, wherein the collection gate substantially covers the photovoltaic active zones.

* * * * *